United States Patent
Cao et al.

(10) Patent No.: US 8,174,051 B2
(45) Date of Patent: May 8, 2012

(54) III-NITRIDE POWER DEVICE

(75) Inventors: Jianjun Cao, Torrance, CA (US);
Yanping Ma, Temecula, CA (US);
Robert Beach, Altadena, CA (US);
Michael A. Briere, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 109 days.

(21) Appl. No.: 11/821,908

(22) Filed: Jun. 26, 2007

(65) Prior Publication Data
US 2009/0001424 A1    Jan. 1, 2009

(51) Int. Cl.
*H01L 21/02* (2006.01)

(52) U.S. Cl. ........ 257/200; 257/109; 257/155; 257/192; 257/E21.407; 257/E29.127

(58) Field of Classification Search .................. 257/192, 257/E21.407, 155, 109, E29.127
See application file for complete search history.

(56) References Cited

U.S. PATENT DOCUMENTS

| | | | | |
|---|---|---|---|---|
| 5,338,961 A * | 8/1994 | Lidow et al. | ................... | 257/342 |
| 5,347,155 A * | 9/1994 | Ludikhuize | ................... | 257/492 |
| 5,610,432 A * | 3/1997 | Ludikhuize | ................... | 257/492 |
| 6,191,453 B1 * | 2/2001 | Petruzzello et al. | .......... | 257/350 |
| 6,320,205 B1 * | 11/2001 | Pfirsch et al. | ................... | 257/77 |
| 6,548,333 B2 * | 4/2003 | Smith | ........................... | 438/172 |
| 2005/0253168 A1 * | 11/2005 | Wu et al. | ....................... | 257/192 |
| 2006/0043501 A1 * | 3/2006 | Saito et al. | .................... | 257/401 |
| 2006/0145189 A1 * | 7/2006 | Beach | ........................... | 257/192 |

* cited by examiner

*Primary Examiner* — Wael Fahmy
*Assistant Examiner* — John C Ingham
(74) *Attorney, Agent, or Firm* — Farjami & Farjami LLP

(57) ABSTRACT

A III-nitride power device that includes a Schottky electrode surrounding one of the power electrodes of the device.

20 Claims, 3 Drawing Sheets

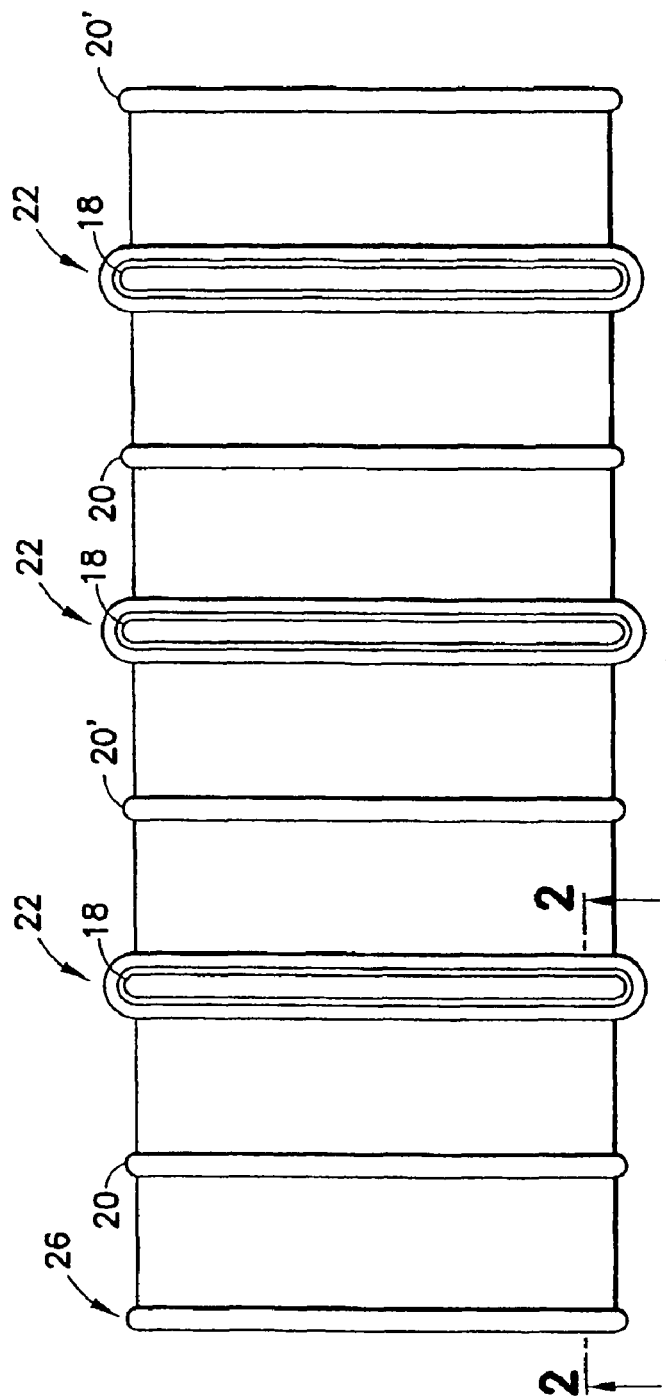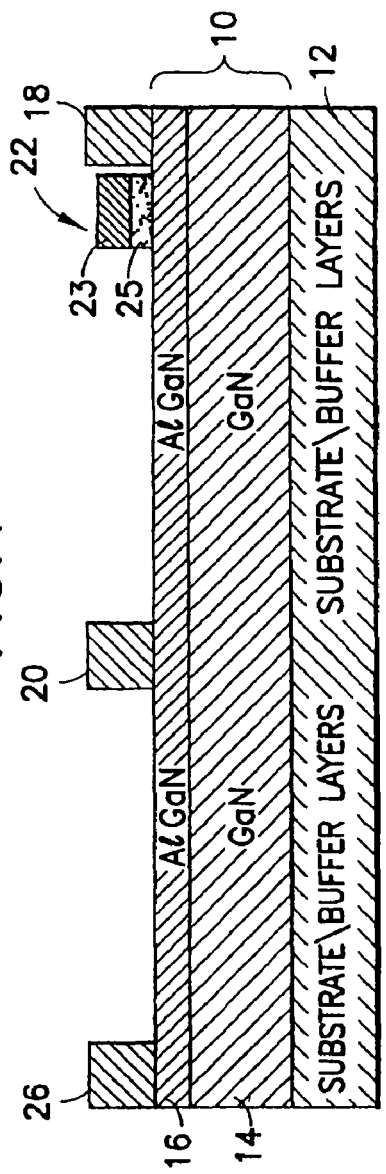
FIG.1
FIG.2

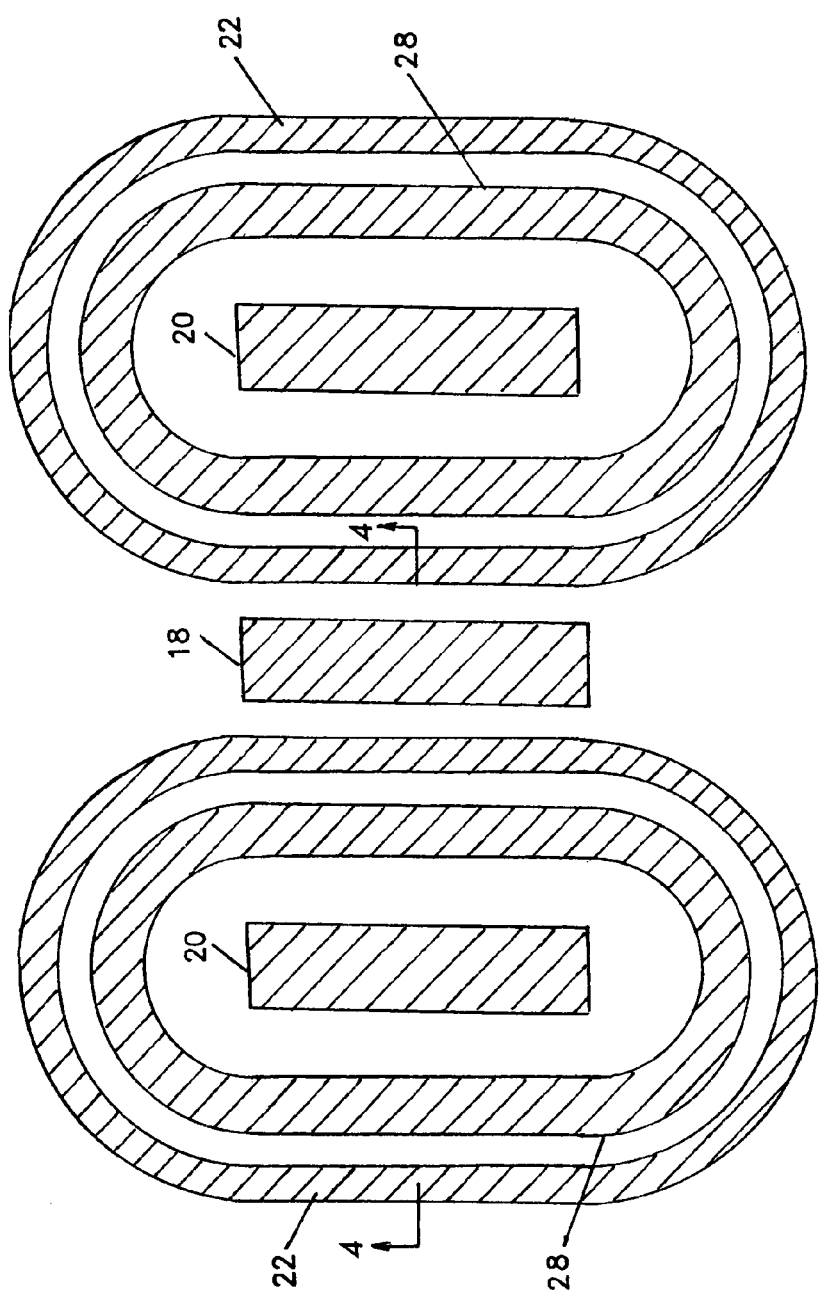
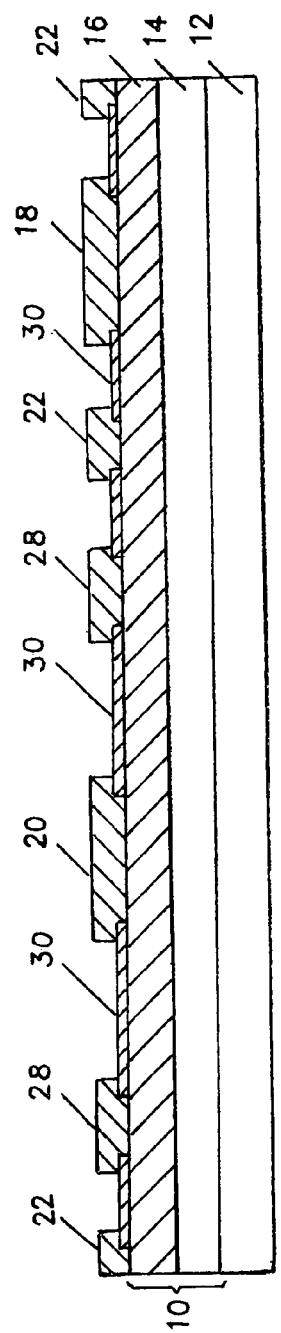
FIG.3
FIG.4

III-NITRIDE POWER DEVICE

DEFINITION

As referred to herein III-nitride refers to a semiconductor alloy from the InAlGaN system, including, but not limited to, GaN, AlGaN, AlN, InGaN, InAlGaN, and the like.

BACKGROUND AND SUMMARY OF THE INVENTION

The present invention relates to a III-nitride heterojunction power semiconductor devices.

III-nitride heterojunction power devices are well known. A typical III-nitride power semiconductor device includes a drain electrode, a source electrode and a gate electrode disposed between the drain electrode and the source electrode. The gate electrode controls the current between the source electrode and the drain electrode.

III-nitride power semiconductor devices are desirable for power applications, for example, power supply applications due their low on resistance and high breakdown voltage.

A device according to the present invention is a monolithic integrated III-nitride power device that includes a heterojunction III-nitride body having a first III-nitride layer, and a second III-nitride layer having a band gap different from that of the first III-nitride layer disposed over the first III-nitride layer, a first power electrode electrically connected to the second III-nitride layer, a second power electrode electrically connected to the second III-nitride layer, a gate structure disposed over the second III-nitride layer between the first power electrode and the second power electrode, and at least one schottky electrode in schottky contact with the second III-nitride layer.

According to one aspect of the present invention, the at least one schottky electrode is spaced from and surrounds one of the power electrodes.

According to another aspect of the present invention, the gate structure surrounds the at least one schottky electrode.

The schottky electrode may be biased to the source voltage may be biased to a different voltage or may be left floating (unbiased)

Embodiments and advantages of the present invention will become apparent from the following description of the invention which refers to the accompanying drawings.

BRIEF DESCRIPTION OF THE DRAWINGS

FIG. 1 shows a top plan view of a portion of a related III-nitride device.

FIG. 2 shows a cross-sectional view of the device of FIG. 1 along line 2-2 viewed in the direction of the arrows.

FIG. 3 shows a top plan view of a device according to an embodiment of the present invention.

FIG. 4 shows a cross-sectional view along line 4-4 in FIG. 3, viewed in the direction of the arrow.

DETAILED DESCRIPTION OF THE EMBODIMENTS

Figure 5:
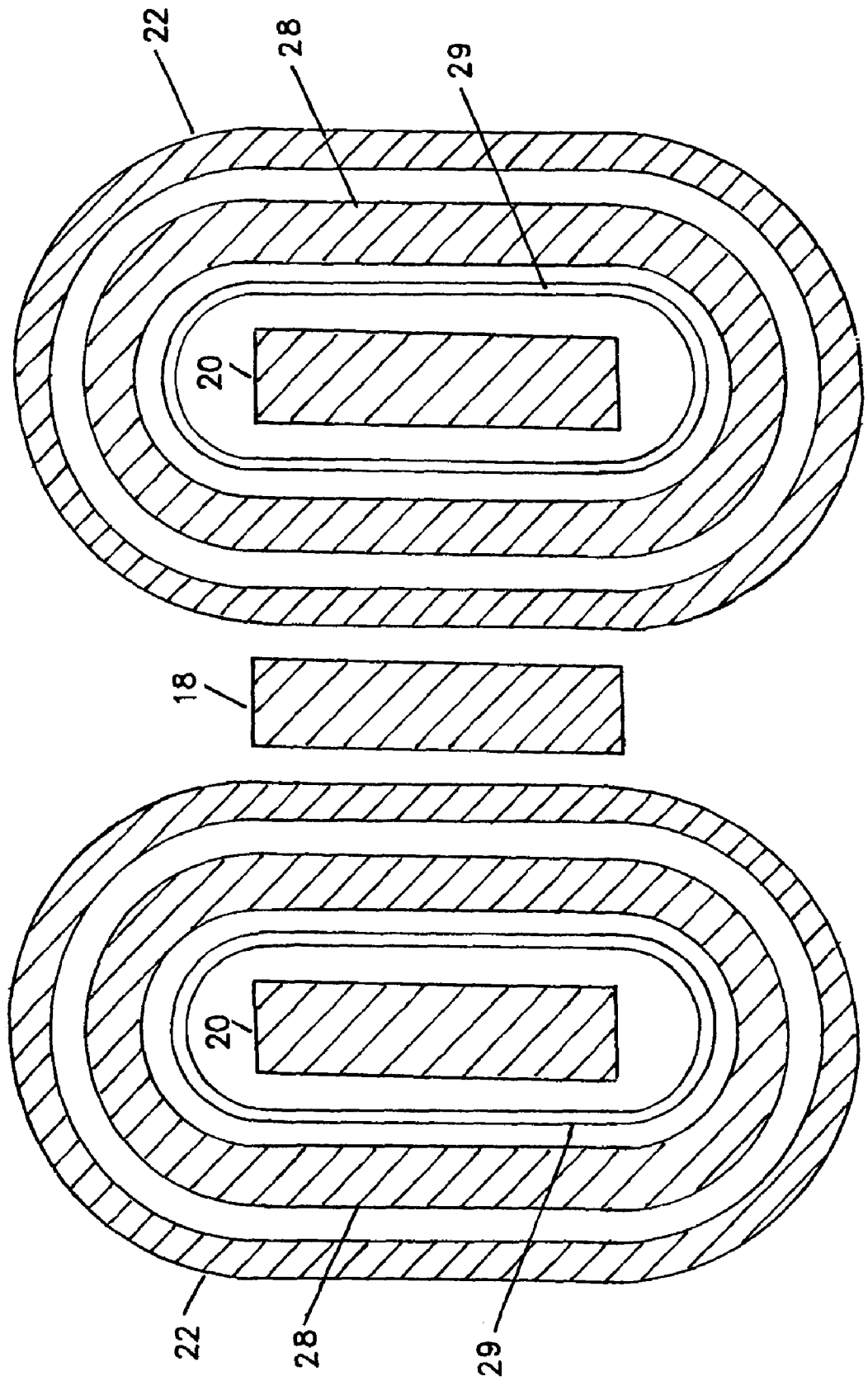
FIG. 5 shows a top plan view of a device according to another embodiment of the present invention.

Referring to FIGS. 1 and 2, a power semiconductor device according to the disclosure of U.S. patent application Ser. No. 11/345,753 (assigned to the assignee of the present application), includes a III-nitride based heterojunction 10 disposed over a support body 12. Heterojunction 10 includes a first III-nitride semiconductor body 14, and a second III-nitride semiconductor body 16 over first III-nitride semiconductor body 14. A first power electrode 18 (i.e. source electrode) and a second power electrode 20 (i.e. drain electrode) are electrically connected to second III-nitride semiconductor body 16 through a direct ohmic connection or any other suitable means. A gate structure 22 is disposed between first power electrode 18 and second power electrode 20 over second III-nitride semiconductor body 14. Gate structure 22 may include gate electrode 23 which is capacitively connected to second III-nitride semiconductor layer 16 through a gate insulation body 25. Alternatively, gate structure 22 may include a schottky gate electrode connected to second III-nitride semiconductor body 16.

FIGS. 1 and 2 further illustrate a schottky electrode 26 provided to make schottky contact with second III-nitride layer 16. A schottky electrode 26 is provided for every nth active cell (each active cell as referred to herein includes at least a first power electrode 18, a second power electrode 20 and a gate structure 22 disposed in between) as shown in order to optimize the use of the active area and achieve the desired efficiency.

Referring to FIGS. 3 and 4, in which like numerals identify like features, a monolithic power semiconductor device according to an embodiment of the present invention includes at least one schottky electrode 28 preferably in each active cell thereof that is spaced from and surrounds second power electrode 20 (e.g. drain electrode) of the device.

Schottky electrode 28 may be shorted to first power electrode 18. Preferably, schottky electrode 28 is shorted to the source electrode of the device. Alternatively, schottky electrode 28 may be left floating (i.e. unbiased).

According to another aspect of the present invention, gate structure 22 is spaced from and surrounds schottky electrode 28.

It should be noted that a device according to the preferred embodiment includes a passivation layer 30 (e.g. silicon nitride or silicon dioxide) disposed on body 16 that includes openings through which the electrodes 18, 20, 28 and gate structure 22 couple to body 16.

In a device according to the present invention schottky electrode 28 can result in the integration of a schottky diode with a III-nitride HFET, the benefits of which are described in U.S. patent application Ser. No. 11/345,753. In addition, schottky electrode 28 acts as a termination structure/field plate to shield gate structure 22 from the drain bias in that drain voltage drop occurs mainly between drain electrode 20 and schottky electrode 28.

Conventional schottky gate HFET has a high gate leakage at a higher drain bias, especially at elevated temperatures. Schottky electrode 28 shields the gate from drain bias, thereby reducing gate leakage.

Without schottky electrode 28, Qgd increases with increasing drain voltage. With schottky electrode 28, gate structure 22 no longer sees drain bias Vds. Thus, the inclusion of schottky electrode 28 will reduce Qgd.

With a schottky electrode 28, gate electrode 22 can be made narrow and its overlap with field dielectric can be made small without suffering a lower breakdown voltage. Thus, total gate charge Qg and gate-drain charge Qgd can be minimized.

Without schottky electrode 28, the electric field near the corner of the gate is the highest, which can cause charge trapping. Charge trapping causes pinch-off voltage (Vp) to shift. The inclusion of Schottky electrode 28 minimizes charge trapping around gate structure 22 and thus results in a more stable Vp.

In one embodiment of the present invention, gate structure may be disposed on and make schottky contact with second III-nitride semiconductor body 16.

In an alternative embodiment, gate structure 22 may include gate insulation body 25 over body 16, and a gate electrode 23 disposed over gate insulation body 25, whereby gate electrode 23 can be capacitively coupled to body 16.

Referring now to FIG. 5, a floating field ring 29 can be added to improve the voltage withstand capability of a device according to the present invention. Thus, floating field ring 29 surrounds electrode 20 (i.e. drain) and is disposed between electrode 20 and schottky electrode 28. Note that this embodiment is not restricted to one field ring, but that additional field rings may be added to increase the voltage withstand capability of the device.

In a device according to any one of the embodiments of the present invention, first III-nitride semiconductor body is an alloy from the InAlGaN system, such as GaN, and second III-nitride semiconductor body 16 is another alloy from the InAlGaN system having a band gap that is different from that of first III-nitride semiconductor 14, whereby a two-dimensional electron gas is formed due to the heterojunction of the first and the second III-nitride semiconductor bodies as is well known in the art. For example, second III-nitride semiconductor body may be formed with AlGaN which may or may not have a GaN cap. Instead of AlGaN other alloys from the InAlGaN system such as Gan/AlGaN/AlInGaN/GaN may be used. Furthermore, a device according to the present invention is not limited to a simple heterojunction, but multiple heterojunctions may be used without deviating from the scope and spirit of the invention.

In addition, support body 12 is a combination of a substrate material and if required a buffer layer on the substrate to compensate for the lattice and thermal mismatch between the substrate and first III-nitride semiconductor body 14. For economic reasons, the preferred material for the substrate is silicon. Other substrate materials such as sapphire, and SiC can also be used without deviating from the scope and the spirit of the present invention.

AlN is a preferred material for a buffer layer. However, a multi-layer or graded transitional III-nitride semiconductor body may also be used as a buffer layer without deviating from the scope and the spirit of the present invention.

It is also possible to have the substrate made from the same material as first III-nitride semiconductor body and thus avoid the need for a buffer layer. For example, a GaN substrate may be used when first III-nitride semiconductor body 14 is formed with GaN.

The gate electrode may be composed of n type or p type silicon, or polysilicon of any desired conductivity, or TiW, aluminum, Ti/Al, refractory silicides, or other metallic layer. Ohmic electrodes may be composed of Ti/Al and may further include other metallic bodies over the top surface thereof such as Ti/TiW, Ni/Au, Mo/Au, or the like. Any other metal system that makes low resistance contact to the 2DEG may be employed. Gate insulation body 28 may be composed of $Si_3N_4$, $Al_2O_3$, $SiO_2$, HfO, MgO, $Sc_2O_3$, or the like. Schottky metal for schottky electrode 26 may include nickel, platinum, palladium, silicides of those metals, or any other metal with sufficient barrier height to keep leakage low.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A monolithic integrated III-Nitride power device comprising:
    a heterojunction III-nitride body including a first III-nitride layer, and a second III-nitride layer having a band gap different from that of said first III-nitride layer disposed over said first III-nitride layer;
    a first power electrode electrically connected to said second III-nitride layer;
    a second power electrode electrically connected to said second III-nitride layer;
    a gate structure; and
    a schottky electrode in schottky contact with said second III-nitride layer and surrounding one of said first and second power electrodes, said schottky electrode disposed between said gate structure and said one of said first and second power electrodes; and
    wherein said gate structure is narrower than said schottky electrode.

2. A power device according to claim 1, said gate structure surrounding said schottky electrode.

3. A power device according to claim 2, wherein said gate structure includes a gate electrode and a gate insulation interposed between said heterojunction and said gate electrode.

4. A power device according to claim 3, wherein said gate insulation is comprised of silicon dioxide.

5. A power device according to claim 3, wherein said gate insulation is comprised of silicon nitride.

6. A power device according to claim 1, wherein said first III-nitride layer is comprised of GaN and said second III-nitride layer is comprised of AlGaN.

7. A power device according to claim 1, wherein said first III-nitride layer is comprised of one alloy of from the InAlGaN system and said second III-nitride layer is comprised of another alloy from the InAlGaN system having a band gap that is different from that of said one alloy.

8. A power device according to claim 1, wherein said first power electrode and said second power electrode make ohmic contact with said second III-nitride layer.

9. A power device according to claim 1, wherein said electrode surrounded by said schottky electrode is the drain electrode.

10. A power device according to claim 1, wherein said schottky electrode is biased to a voltage.

11. A power device according to claim 1, further comprising at least one field plate ring disposed around said one of said electrodes and between said one of said electrodes and said schottky electrode.

12. A power device according to claim 1, wherein said schottky electrode is surrounding and spaced from said one of said first and second power electrodes.

13. A III-Nitride device comprising:
    a heterojunction III-nitride body including a first III-nitride layer, and a second III-nitride layer having a band gap different from that of said first III-nitride layer disposed over said first III-nitride layer;
    a source electrode electrically connected to said second III-nitride layer;
    a drain electrode electrically connected to said second III-nitride layer;
    a gate structure; and
    a schottky electrode in schottky contact with said second III-nitride layer and surrounding and spaced from said drain electrode, said schottky electrode disposed between said gate structure and said drain electrode; and wherein said gate structure is narrower than said schottky electrode.

14. A device according to claim 13, said gate structure surrounding said schottky electrode.

15. A device according to claim 14, wherein said gate structure includes a gate electrode and a gate insulation interposed between said heterojunction and said gate electrode.

16. A device according to claim 13, wherein said first III-nitride layer is comprised of one alloy of from the InAlGaN system and said second III-nitride layer is comprised of another alloy from the InAlGaN system having a band gap that is different from that of said one alloy.

17. A device according to claim 13, wherein said source electrode and said drain electrode make ohmic contact with said second III-nitride layer.

18. A device according to claim 13, wherein said schottky electrode is biased to a voltage.

19. A device according to claim 13, wherein said schottky electrode is shorted to said source electrode.

20. A device according to claim 13, further comprising at least one field plate ring disposed around said drain electrode and between said drain electrode and said schottky electrode.

* * * * *